US007995381B2

(12) United States Patent
Nirschl et al.

(10) Patent No.: US 7,995,381 B2
(45) Date of Patent: Aug. 9, 2011

(54) METHOD OF PROGRAMMING RESISTIVITY CHANGING MEMORY

(75) Inventors: Thomas Nirschl, Munich (DE); Jan Otterstedt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 378 days.

(21) Appl. No.: 12/258,913

(22) Filed: Oct. 27, 2008

(65) Prior Publication Data

US 2010/0103722 A1    Apr. 29, 2010

(51) Int. Cl.
*G11C 11/00* (2006.01)
(52) U.S. Cl. .......................................... 365/163; 365/148
(58) Field of Classification Search .................. 365/148, 365/163
See application file for complete search history.

(56) References Cited

U.S. PATENT DOCUMENTS

| | | | |
|---|---|---|---|
| 6,687,155 B2 * | 2/2004 | Nagasue | 365/185.03 |
| 6,754,097 B2 | 6/2004 | Sharma et al. | |
| 7,149,108 B2 | 12/2006 | Rinerson et al. | |
| 7,254,073 B2 | 8/2007 | Roehr | |
| 7,400,521 B1 | 7/2008 | Hoenigschmid | |
| 7,495,971 B2 | 2/2009 | Egerer | |
| 7,529,124 B2 * | 5/2009 | Cho et al. | 365/163 |
| 7,593,255 B2 * | 9/2009 | Happ et al. | 365/163 |
| 7,646,632 B2 * | 1/2010 | Philipp et al. | 365/163 |
| 7,778,070 B2 * | 8/2010 | Nirschl et al. | 365/163 |
| 7,791,935 B2 * | 9/2010 | Kang et al. | 365/163 |
| 7,864,565 B2 * | 1/2011 | Nirschl et al. | 365/163 |
| 2007/0236987 A1 | 10/2007 | Cho et al. | |
| 2008/0043513 A1 | 2/2008 | Hoenigschmid et al. | |
| 2008/0080226 A1 | 4/2008 | Mikolajick et al. | |
| 2008/0080232 A1 | 4/2008 | Sturm et al. | |

OTHER PUBLICATIONS

Mantegazza et al., Statistical analysis and modeling of programming and retention in PCM arrays, IEEE, 2007, pp. 311-314.

* cited by examiner

*Primary Examiner* — VanThu Nguyen
(74) *Attorney, Agent, or Firm* — Dicke, Billig & Czaja, PLLC (57) ABSTRACT

A method of operating an integrated circuit includes determining a resistance value of at least one resistivity-changing memory cell when the memory cell is in a low-resistance state, the at least one resistivity-changing memory cell configured to be programmable to at least the low-resistance state and a high-resistance state, comparing the resistance value to a threshold value, selecting, based on the comparison, a cell reset process to be employed for programming the at least one resistivity-changing memory cell to the high-resistance state. The selecting includes selecting a predetermined reset process as the cell reset process when the resistance value is less than the threshold value, and adjusting the predetermined process and selecting the adjusted predetermined reset process as the cell reset process when the resistance value is at least equal to the threshold value.

24 Claims, 10 Drawing Sheets

METHOD OF PROGRAMMING RESISTIVITY CHANGING MEMORY

BACKGROUND

One type of non-volatile memory is resistive memory. Resistive memory utilizes the resistance value of a memory element to store one or more bits of data. For example, a memory element programmed or "set" to a low resistance value may represent a logic "0" data bit value, and a memory element programmed or "reset" to a high resistance value may represent a logic "1" data bit value. Typically, the resistance value of the memory element is electrically switched by applying a voltage pulse or a current pulse to the memory element.

One type of resistive memory is phase change memory. Phase change memory uses a phase change material in the resistive memory element. The phase change material exhibits at least two different states. The states of the phase change material may be referred to as an amorphous state and as a crystalline state, where the amorphous state involves a more disordered atomic structure and the crystalline state involves a more ordered lattice. The amorphous state usually exhibits higher resistivity than the crystalline state. Some phase change materials exhibit multiple crystalline states, e.g. a face-centered cubic (FCC) state and a hexagonal closest packing (HCP) state, which have different resistivities and may be used to store bits of data. In the present disclosure, the amorphous state generally refers to the state having the higher resistivity while the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells employing phase change material may be programmed to store data utilizing the memory states of the phase change material. One way to read and write data in such a phase change memory device is to control a current and/or a voltage pulse that is applied to the phase change material. The temperature of the phase change material in each memory cell generally corresponds to the level of current and/or voltage applied to achieve the heating. The power used to program a memory cell is based on the electrical and thermal interface between the phase change material and at least one electrode contacting the phase change material.

For some non-volatile memories, such as FLASH memories, for example, potential memory errors are reduced by performing a read operation subsequent to a write operation (a so-called "verify read") to identify/detect memory cells which are too close to the margins of a predetermined sensing window. Such memory cells are sometimes referred to as "weak cells" or "weak bits". According to some techniques, error correction code techniques are applied to correct such weak bits, while other techniques perform a so-called "hard read" wherein a reference value is changed around a nominal read condition. With respect to FLASH memories, a verify read operation can be "hidden" since the timing is substantially the same as a normal read operation.

However, with respect to phase change memories, conventional techniques typically employ two additional read operations to verify that an acceptable write distribution (as measured by memory cell resistance levels) has been achieved. The two additional reads operation are commonly referred to as a "verify SET" and a "verify RESET" (and referred to collectively as a "two-sided read"), and respectively ensure that the resistance value of a phase change memory cell has an acceptable margin with respect to an expected SET resistance distribution and with respect to an expected RESET resistance distribution. While the duration of a verify SET does not exceed that of a standard READ operation of the phase change memory (e.g. 40 ns), a verify RESET, due to the large resistances of cells in the RESET state, has a much longer duration (e.g. 600 ns) which slows the operating speed of the phase change memory. This slow operating speed, relative to FLASH memories, generally prevents phase change memories from replacing FLASH memories in many applications.

For these and other reasons, there is a need for the present invention.

SUMMARY

One embodiment provides a method of operating an integrated circuit, the method including determining a resistance value of at least one resistivity-changing memory cell when the memory cell is in a low-resistance state, the at least one resistivity-changing memory cell configured to be programmable to at least the low-resistance state and a high-resistance state, comparing the resistance value to a threshold value, selecting, based on the comparison, a cell reset process to be employed for programming the at least one resistivity-changing memory cell to the high-resistance state. The selecting includes selecting a predetermined reset process as the cell reset process when the resistance value is less than the threshold value, and adjusting the predetermined process and selecting the adjusted predetermined reset process as the cell reset process when the resistance value is at least equal to the threshold value.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. It is to be understood that the features of the various exemplary embodiments described herein may be combined with each other, unless specifically noted otherwise. The following detailed description, therefore, is not to be taken in a limiting sense, and the scope of the present invention is defined by the appended claims.

Figure 1:
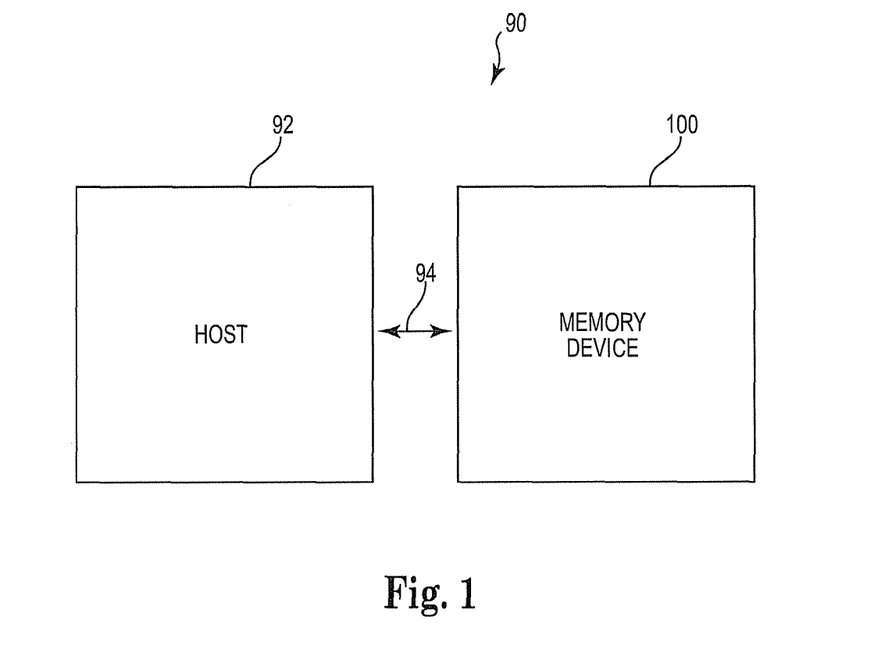
FIG. 1 is a block diagram illustrating one embodiment of a system including a memory device.

FIG. 1 is a block diagram illustrating one embodiment of a system 90 which includes a host 92 and a memory device 100, in accordance with embodiments described herein. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or other suitable device that uses memory. Memory device 100 provides memory for host 92. In one embodiment, memory device 100 includes a phase change memory device or other suitable resistive or resistivity changing material memory device.

Figure 2:
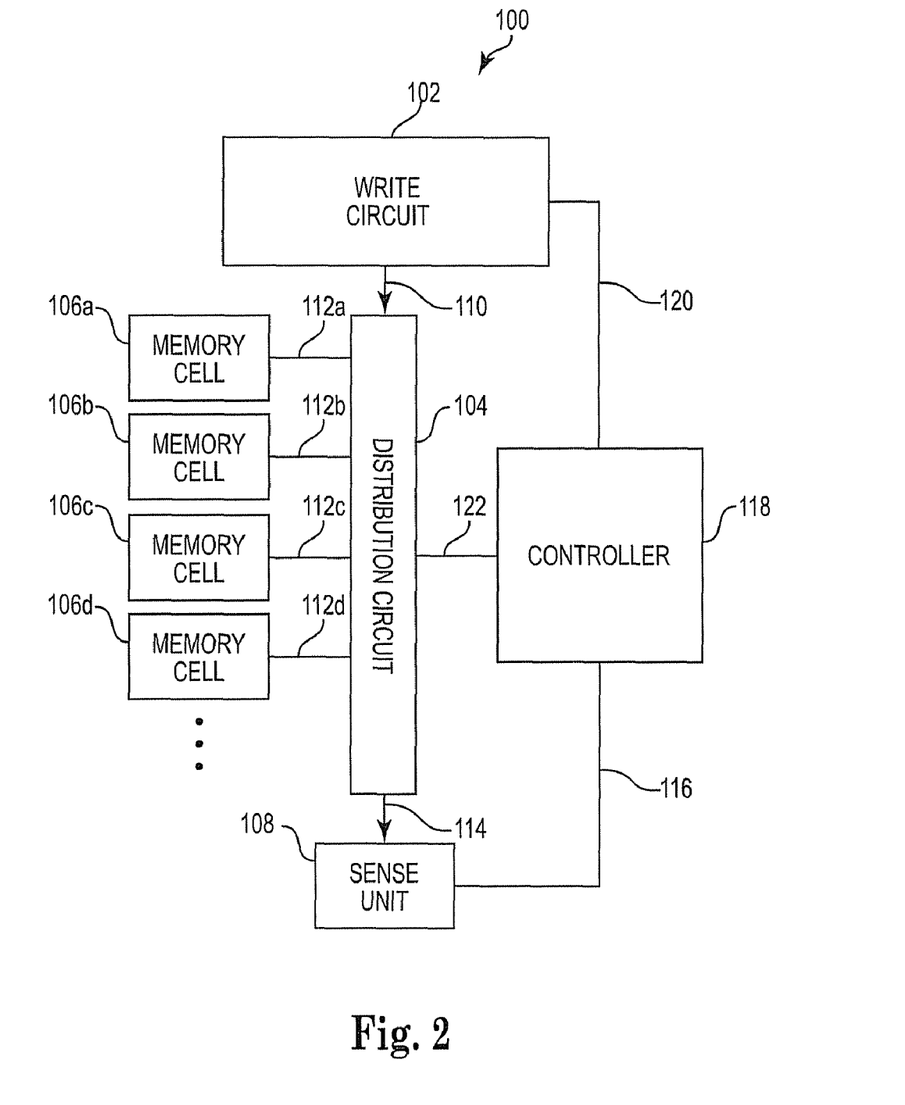
FIG. 2 is a block diagram illustrating one embodiment of a memory device.

FIG. 2 is a block diagram illustrating one embodiment of memory device 100. In one embodiment, memory device 100 is an integrated circuit or part of an integrated circuit. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. According to one embodiment, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material and hence the cell resistance is controlled using a suitable write strategy.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122. It is noted that as used herein, the term "electrically coupled" does not mean that the elements must be directly coupled together, but that intervening elements may be provided between the "electrically coupled" elements.

Each of the memory cells 106a-106d includes a phase change material which, under the influence of temperature change, may be changed from an amorphous state to a crystalline state and vice versa. The amount of crystalline phase change material coexisting with amorphous phase change material in each of the memory cells 106a-106d defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11". In other embodiments, the two or more states can be any suitable number of states in the phase change material of a memory cell.

In one embodiment, the phase change material comprises a chalcogenide material, such as a chalcogenide alloy or germanium, antimony, and tellurium (GeSbTe), for example. In other embodiments, the teachings of the present disclosure may be adapted for use with memories employing metal oxide materials (e.g. nickel oxides, iron oxides) which exhibit resistivity changing aspects. Additionally, although described primarily herein with regard to phase change memory (e.g. PCRAM), the teachings of the present disclosure may uses with other resistivity changing memories, such as CBRAM (conductive-bridging RAM), for example, and may be adapted for use with other suitable types of memories such as FeRAM (ferroelectric RAM) and MRAM (magnetoresistive RAM), for example.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d.

In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, to read the resistance of a given one of the memory cells 106a-106d, sense circuit 108 provides current that flows through the given one of the memory cells 106a-106d and sense circuit 108 reads the voltage across the given one of the memory cells 106a-106d. In another embodiment, sense circuit 108 provides voltage across the given one of the memory cells 106a-106d and reads the current that flows through the given one of the memory cells 106a-106d. In another embodiment, write circuit 102 provides voltage across one of the memory cells 106a-106d and sense circuit 108 reads the current that flows through the given one of the memory cells 106a-106d. In another embodiment, write circuit 102 provides current through the given one of the memory cells 106a-106d and sense circuit 108 reads the voltage across the given one of the memory cells 106a-106d.

To program a target cell of the memory cells 106a-106d within memory device 100, write circuit 102 generates one or more current or voltage pulses for heating the phase change material in the target memory cell. In one embodiment, write circuit 102 generates appropriate current or voltage pulses, which are fed into distribution circuit 104 and distributed to the appropriate target memory cell 106a-106d. The amplitude and duration of the current or voltage pulses are controlled depending on whether the memory cell is being set or reset.

Typically, a "set" operation of a memory cell includes heating the phase change material of the target memory cell above its crystallization temperature (but usually below its melting temperature) long enough to achieve the crystalline state or a partially crystalline and partially amorphous state. A "reset" operation of a memory cell typically includes heating the phase change material of the target memory cell above its melting temperature, and then quickly quench cooling the material, thereby achieving the amorphous state or a partially amorphous and partially crystalline state.

Figure 3:
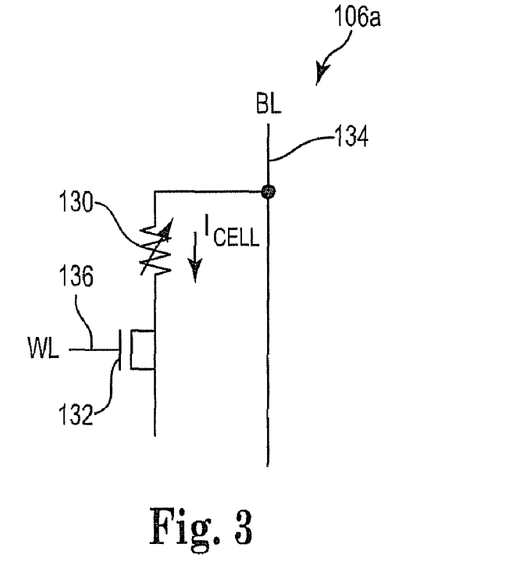
FIG. 3 is a schematic diagram illustrating an example of a phase change memory cell.

FIG. 3 illustrates an example of a phase change memory cell, such as phase change memory cell 106a of FIG. 2. Memory cell 106a includes a phase change material element 130 and a select transistor 132, with phase change material element 130 being coupled between a bit line 134 and access transistor 132. A word line 136 is coupled to a gate of access transistor 132. Bit line 132 and word line 136 represent a portion of signal path 112a between memory cell 106a and distribution circuit 104. As mentioned above, to program or set phase change material element 130 of memory cell 106a to a low-resistance or crystalline state, or to reset phase change material element 130 to a high resistance or amorphous state, access transistor 132 is activated and one or more current or voltage pulses are controllably provided by controller 102 to generate a desired temperature profile or pulse with which to heat phase change material element 130.

Figure 4:
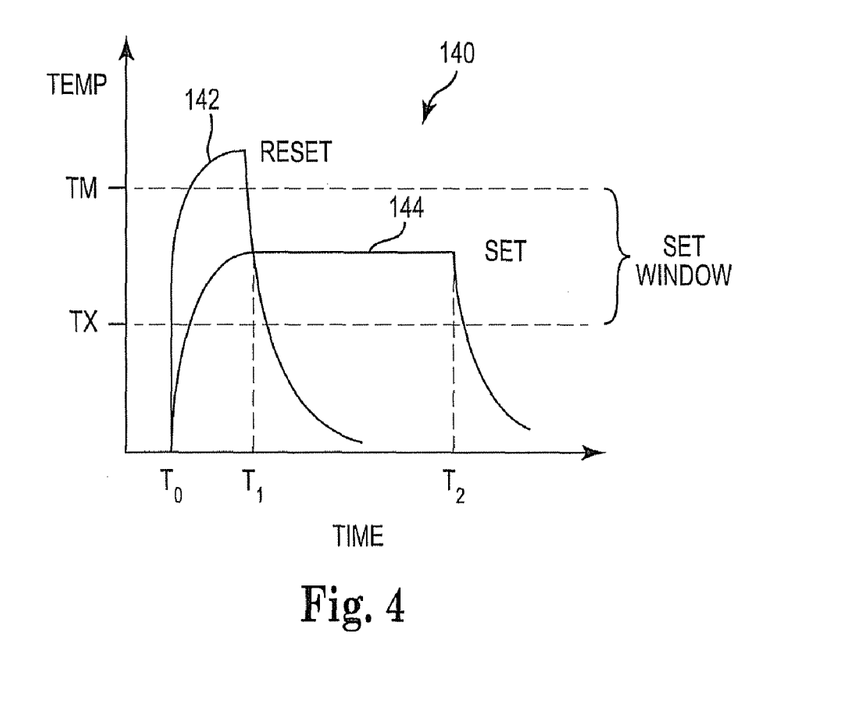
FIG. 4 is a graph illustrating examples of set and reset temperature pulses.

FIG. 4 is a graph 140 illustrating examples of an amorphizing or reset temperature pulse 142 and a crystallizing or set temperature pulse 144. As illustrated by reset temperature pulse 142, to program phase change material element 130 to the amorphous or reset state, the phase change material element 130 is heated above its melting temperature $T_M$ for a relatively short time period, from about $T_0$ to $T_1$. In contrast, as illustrated by set temperature pulse 144, to program phase change material element 130 to the crystalline or set state, the phase change material element 130 is heated above its crystallizing temperature $T_X$ but below the melting temperature $T_M$ for a relatively long time period, from about $T_0$ to $T_2$. The temperature range between the melting temperature $T_M$ and the crystallizing temperature $T_X$ is sometimes referred to as the "set window".

Figure 5:
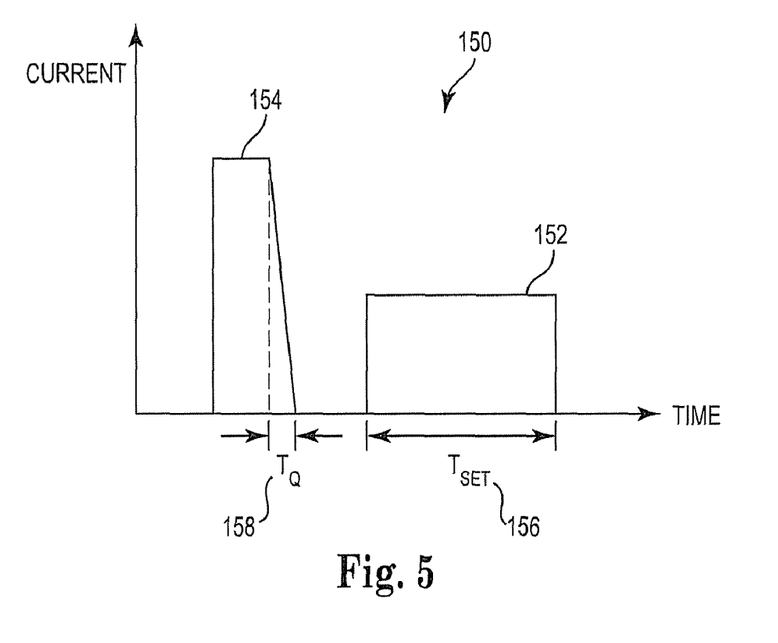
FIG. 5 is a graph illustrating examples of set and reset current pulses.

FIG. 5 is a graph 150 illustrating examples of a set current pulse 152 and a reset current pulse 154 which may be applied by write circuit 102 to heat phase change material element 130 of memory cell 106a. As expected from the temperature pulses of FIG. 3, reset current pulse 154 has a larger amplitude but a shorter duration relative to set current pulse 152. The duration or set time, $T_{SET}$, of set pulse 152 is indicated at 156, and a quench time, $T_Q$, of reset pulse 154 is indicated at 158. The magnitudes and timings of the set current and reset current pulses 152 and 154 may vary depending on the construction of phase change material element 130 (e.g. size and type of electrodes) and on the type of phase change material employed (e.g. GeSbTe alloys). When writing or programming memory cells (e.g. memory cell 106a) to a SET or RESET state, the set and reset current pulses (e.g. set and reset current pulses 152 and 154) are configured so that the resistance level of the memory cells fall within a desired SET resistance range and a desired RESET resistance range.

Figure 6:
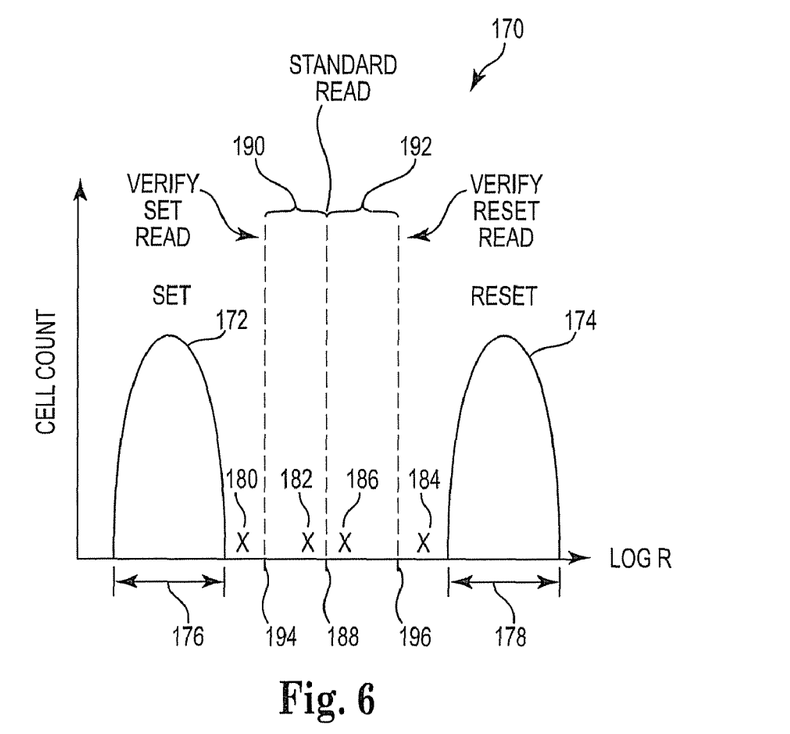
FIG. 6 is a graph illustrating examples of set and reset resistance distribution curves.

FIG. 6 is a graph 170 illustrating an example of a SET resistance distribution curve 172 and of a RESET resistance distribution curve 174 for an array of memory cells of a phase change memory device, such as memory device 100. A logarithmic value of the ohmic resistance of (Log R) is indicated along the x-axis and a number of memory cells of the array at a given resistance (Cell Count) is indicated along the y-axis. As illustrated, resistance values for the SET state of the memory cells are generally distributed over a SET resistance range 176, which is typically in the tens of kilo-ohms, and resistance values for the RESET state of the memory cells are generally distributed over a RESET resistance range 178, which is typically in the tens of mega-ohms.

While a large majority of the memory cells have SET and RESET resistance values which fall within desired SET and RESET resistance ranges 176 and 178, for various reasons (e.g. temperature variations, anomalies in the phase change material) the SET and RESET resistance values exhibited by at least a portion of the memory cells typically do not fall within the desired resistance ranges. For example, after a SET operation, some memory cells may have a resistance above desired SET resistance range 176, as illustrated by memory cells at 180 and 182, and after a RESET operation, some memory cells may have a resistance level below the desired RESET resistance range 178, as illustrated by memory cells at 184 and 186. Such cells are commonly referred to as "outlying" memory cells, or simply "outliers", and create the potential for memory errors and reduced reliability of the memory device, such as memory device 100.

According to one embodiment, during a read operation to determine the logic state of a memory cell, such as memory cell 106a, controller 118 compares the resistance of the memory cell measured by sense circuit 108 to a standard read resistance level, such as indicated by the dashed line at 188. In one embodiment, cells having a resistance level below standard read resistance level 188 are deemed to be in a SET state and to have a logic value "0" (or "1"), while cells having a resistance level above standard read resistance level 188 are deemed to be in a RESET state and to have a logic value "1" (or "0"). While such a technique works well for the majority of memory cells, the resistance values of some memory cells, such as outliers 182 and 186, for example, may be too close to standard read level 188 to accurately determine whether the memory cell is in the SET (crystalline) or RESET (amorphous) state. For example, if the resistance value of such an outlying cell is inadvertently altered by a slight amount (e.g. due to temperature variations), the memory cell's resistance value may indicate logic "0" when, in fact, the memory cell is intended to indicate a logic "1", and vice-versa.

To address this situation, conventional techniques typically maintain a SET margin 190 between a SET resistance value of a memory cell and standard read resistance level 188, and a RESET margin 192 between a RESET resistance value of a memory cell and standard read resistance level 188. According to such conventional techniques, after a write operation has been performed, a "two-sided" read is performed (i.e., a read on each "side" of standard read resistance level 188) to verify that SET and RESET margins 190 and 192 have been achieved for each of the written bits. A verify SET is performed to verify that SET bits have a resistance level below a verify SET resistance level, indicated by the dashed line at 194, and a verify RESET is performed to verity that RESET bits have a resistance level above a RESET resistance level, indicated by the dashed line at 196.

Memory cells with resistance levels not having at least the desired SET or RESET margins 190 and 192 may be re-written to achieve at least the desired margin or may be mapped to another cell location, for example. While such techniques ensure desired SET and RESET margins 190 and 192 are achieved with respect to standard read resistance level 188, due to the large resistance values of cells in the RESET state, a duration of a verify RESET read operation (e.g. 600 ns) greatly exceeds that of a standard read operation (e.g. 40 ns) and slows the operating speed of memory device 100.

As described in greater detail below with respect to FIGS. 7 and 8, a direct correlation has been shown to exist between phase change memory cells having SET resistance levels which are greater than desired SET resistance range 176, such as outliers 182, and memory cells having RESET resistance levels which are less than desired RESET resistance range 178, such as outliers 186. In other words, a memory cell having a SET resistance level which is above desired SET resistance range 176 will also exhibit a RESET resistance level which is below desired RESET resistance range 178. This means outliers 182 and outliers 186 comprise substantially the same memory cells. One explanation for this direct correlation is that it may be due to localized variations in the composition of the phase change material of the memory cells across the memory array.

Figure 7:
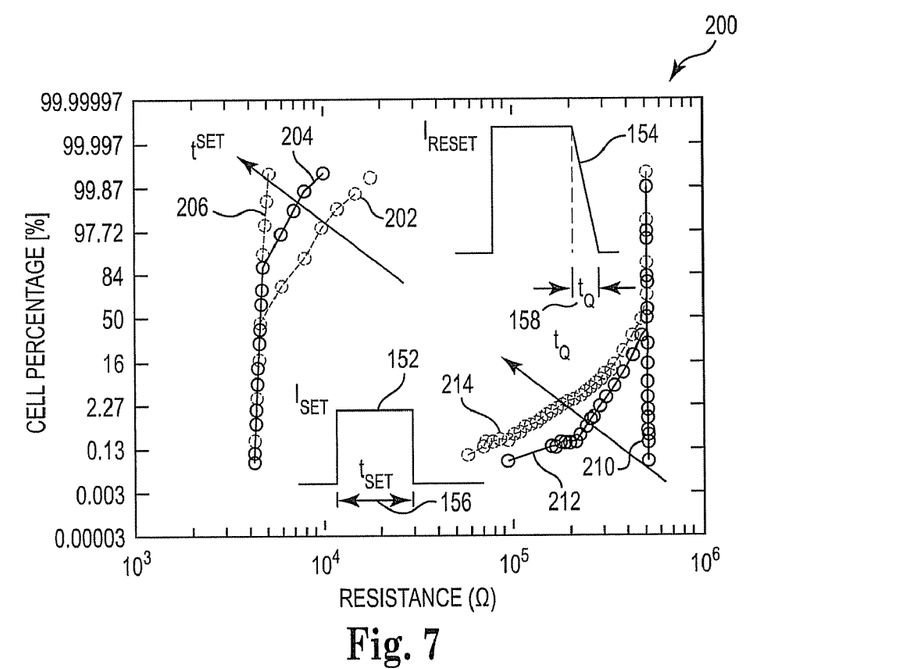
FIG. 7 is a graph illustrating set and reset resistance distributions of a resistivity changing memory cells.

FIG. 7 is a graph 200 illustrating SET resistance distributions and RESET resistance distributions of memory cells of an example memory device in response to SET pulses having increasing set times, such as $T_{SET}$ 156 of SET pulse 152, and to RESET pulses having increasing quench times, such as $T_Q$ 158 of RESET pulse 154, for example (see FIG. 5). Curve 202 represents the SET resistance distribution with $T_{SET}$ 156 at a first duration, curve 204 represents the SET resistance distribution with $T_{SET}$ 156 at a second duration, which is greater that the first duration, and curve 206 represents the SET resistance distribution with $T_{SET}$ 156 at a third duration, which is greater than the second duration. As demonstrated by curves 202, 204, and 206, the number memory cells having a SET resistance which is above a desired SET resistance range 176 (see FIG. 6) decreases with increasing $T_{SET}$ 156 (i.e. the "tail" of the curves 202, 204, and 206 decreases with increasing $T_{SET}$ 156). In general, longer SET pulses 152 result in more crystallization of the phase change material and, thus, a lower resistance value.

Similarly, curve 210 represents the RESET resistance distribution with quench time $T_Q$ 158 at a first duration, curve 212 represents the RESET resistance distribution with $T_Q$ 158 at a second duration, which is greater that the first duration, and curve 214 represents the RESET resistance distribution with $T_Q$ 158 at a third duration, which is greater than the second duration. As demonstrated by curves 210, 212, and 214, the number memory cells having a RESET resistance which is below a desired RESET resistance range 178 (see FIG. 6) increases with increasing $T_Q$ 158 (i.e. the "tail" of the curves 210, 212, and 214 increases with increasing $T_Q$ 158). In general, longer quench times $T_Q$ 158 of RESET pulses 154 result in more crystallization of the phase change material and, thus, a lower resistance value.

Figure 8:
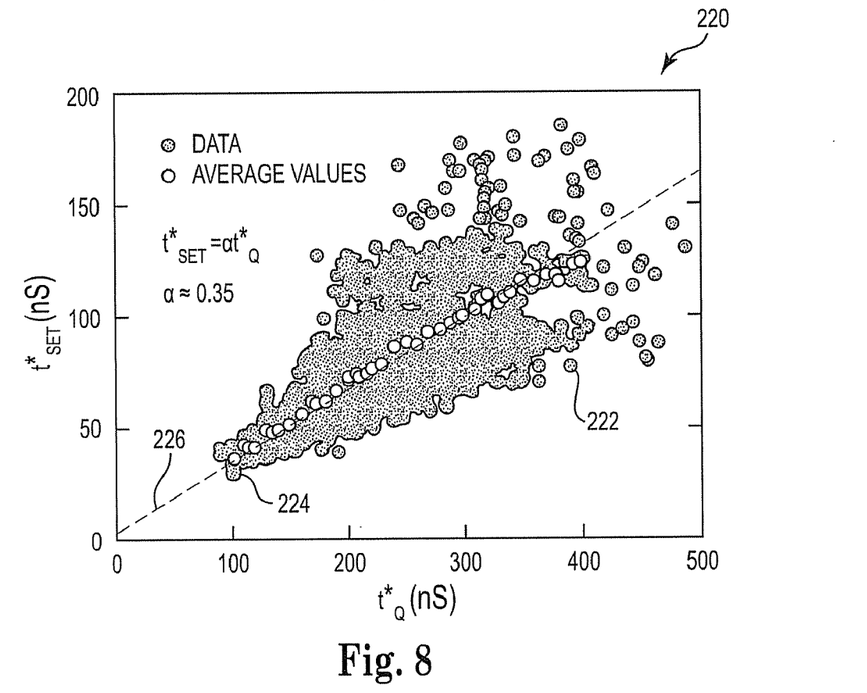
FIG. 8 is a scatter plot illustrating critical quench times and critical reset times required for resistances of memory cells to reach a threshold value.

FIG. 8 is a scatter plot 220 which illustrates a critical quench time ($t^*_Q$) and a critical reset time ($t^*_{SET}$) required for the resistance value of each of the memory cells used to generate FIG. 7 to drop below a threshold resistance value. In FIG. 8, each of the lighter colored or "gray" data points, such as illustrated by data point 222, represents a measured memory cell. The darker colored or "black" data points, such as illustrated by data point 224 represent an average of the $t^*_{SET}$ values at a given value of $t^*_Q$.

As illustrated by FIG. 8, the average $t^*_{SET}$ values generally fall along a line, as indicated by dashed line 226, thereby demonstrating a linear relationship between $t^*_Q$ and $t^*_{SET}$. In fact, in the illustrated example, the relationship $t^*_Q$ and $t^*_{SET}$ can be described by the linear equation $t^*_{SET} = \alpha \, t^*_Q$, wherein $\alpha = 0.35$ for this particular example. This linear relationship illustrates that characteristics of both set time, $T_{SET}$ 156, and quench time, $T_Q$ 158, obey the same crystallization kinetics of the phase change material employed by the memory cells. In other words, those memory cells having SET resistance levels above a desired SET resistance range are the same cells having RESET resistance levels below a desired RESET resistance range (i.e. a direct correlation).

According to embodiments of the present disclosure, based on this direct correlation, the SET resistance characteristics of memory cells, such as memory cell 106a, are employed to modify RESET and/or SET operations of memory cells to better ensure proper write operations and, as a result, reduce memory errors and increase the performance of a phase change memory device, such as memory device 100. According to one embodiment, the SET resistance value of a memory cell is used to predict the RESET resistance value of the memory cell and, when the SET resistance level is above a threshold value (meaning that the RESET resistance value is not within a desired RESET resistance range), to employ adjusted or modified RESET operations to better ensure that an acceptable RESET resistance level is achieved for the memory cell. In one embodiment, a single-sided and relatively fast verify SET read operation (e.g. <60 ns) is employed to both ascertain the actual SET resistance value of a memory cell and to predict whether its RESET resistance value will be within a desired RESET resistance range, thereby eliminating the need for a time consuming verify RESET read operation (e.g. ~600 ns) and improving the operating speed/performance of the memory device.

Figure 9:
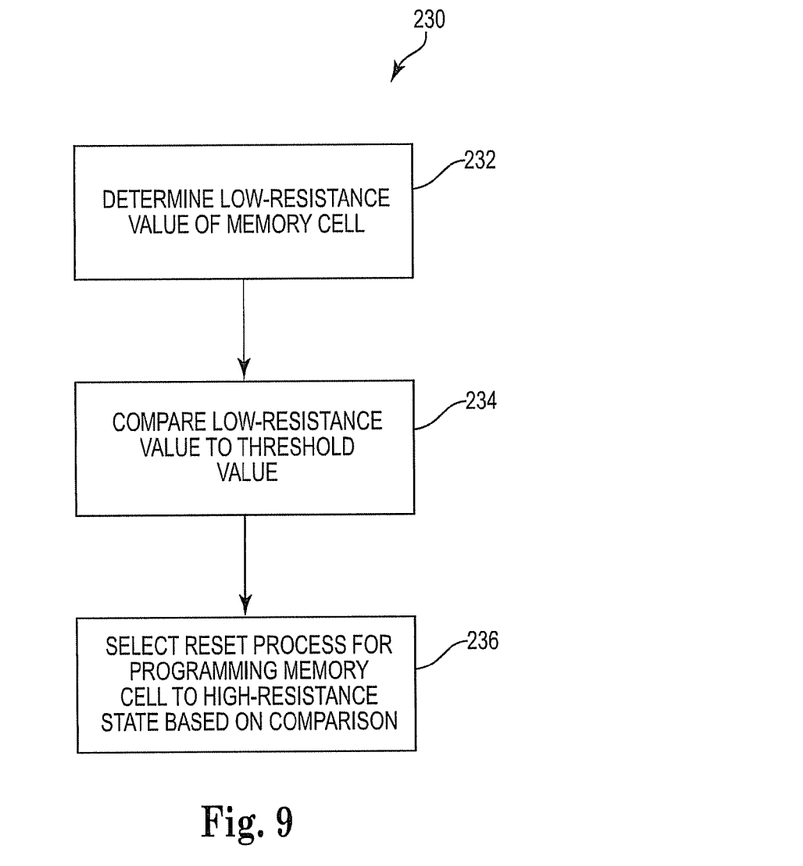
FIG. 9 is a flow diagram generally illustrating one embodiment of a process for programming a phase change memory.

FIG. 9 is a flow diagram generally illustrating one embodiment of a process 230 for programming data to a phase change memory, such as phase change memory device 100, employing SET resistance values of memory cells to predict RESET resistance values and adjust RESET operations thereof. Process 230 begins at 232 with determining a resistance value of at least one resistivity-changing memory cell (e.g. memory cell 106a) when the memory cell is in a low-resistance state, the memory cell configured to be programmable to at least the low-resistance and a high-resistance state.

At 234, the resistance value at the low-resistance state is compared to a threshold value (e.g. verify SET resistance level 194 of FIG. 6). At 236, based on the comparison, a cell reset process to be employed for programming the memory cell to the high-resistance memory state is selected. According to one embodiment, a predetermined cell reset process is selected when the resistance value is less than the threshold value. According to one embodiment, the predetermined cell reset process is adjusted and the adjusted predetermined reset process is selected as the cell reset process when the resistance value is at least equal to the threshold value.

Figure 10:
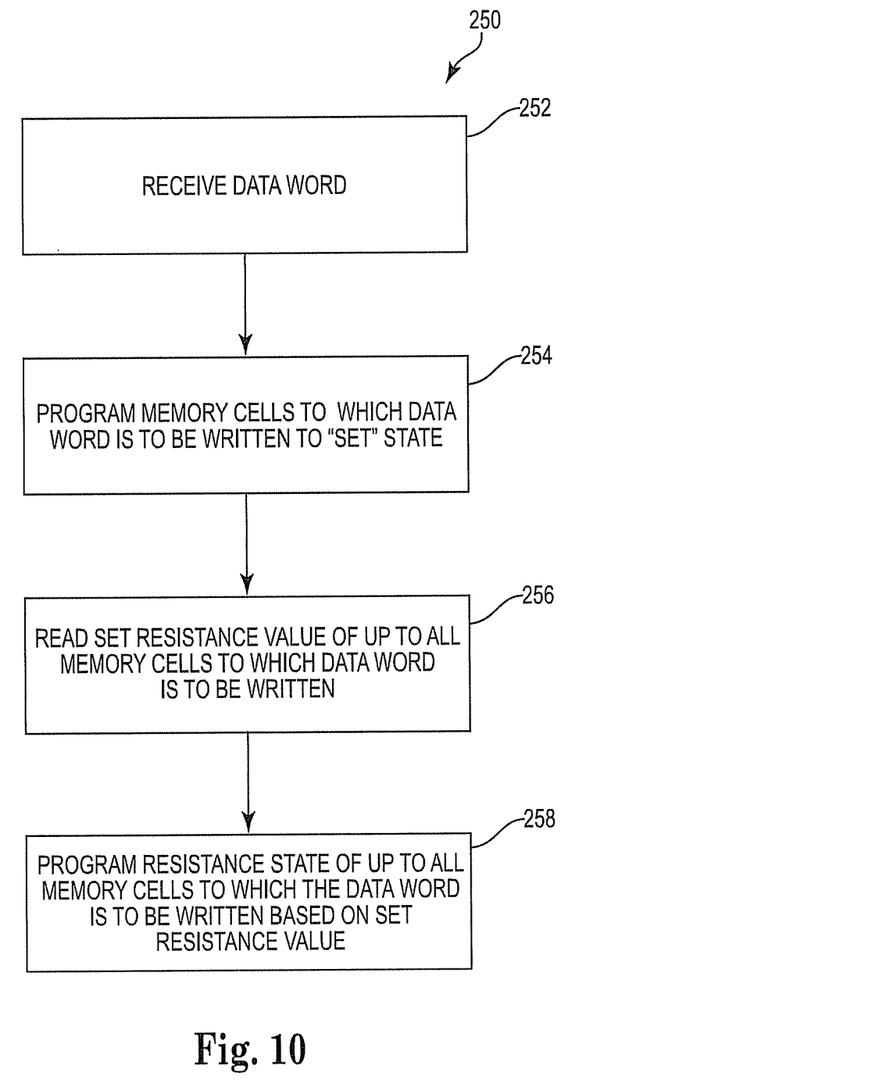
FIG. 10 is a flow diagram generally illustrating a process for writing data to a phase change memory.

FIG. 10 is a flow diagram generally illustrating a process 250 for writing data to a phase change memory, such as phase change memory device 100, for example, employs predictive memory cell operation based on SET resistance values of memory cells, according embodiments described by the present disclosure. Process 250 begins at 252 with memory device 100 receiving a data word consisting of a plurality of data bits (e.g. 16, 32, 64), such as from host 92. Each data bit is to be written to a corresponding one of a plurality of resistivity changing memory cells of memory device 100, such as memory cell 106a, and has one of a first logic value and a second logic value (e.g. a logic "0" and logic "1") which corresponds to one of at least two resistance states of a memory cell, including a low resistance state and a high resistance state, such as a substantially crystalline state and a substantially amorphous state. For example, in one embodiment, the first logic value is a logic "0" and corresponds to a low resistance or substantially crystalline state (SET state) of the memory cell, and the second logic value is a logic "1" and corresponds to a high resistance or substantially amorphous state (RESET state) of the memory cell. Although referred to herein primarily as resistivity changing memory cells, it is noted that such cells are also sometimes referred to as programmable resistance memory cells.

At 254, each of the memory cells to which the received data word is to be stored is programmed or written to the SET state (a logic "0" in the present example), such as by controller 118 via write and distribution circuits 102 and 104. At 256, a verify SET read is performed, such as via sense circuit 108, to determine the SET resistance value for up to all of the memory cells to which the data word is to be written. In one embodiment, a verify SET read is performed to determine a SET resistance value for only those memory cells which must be programmed to the RESET state to represent the logic value (a logic "1" in the present example) of the corresponding data bit of the data word. In one embodiment, a verify SET read is performed to determine the SET resistance value for each memory cell to which the data word is to be written regardless of whether the memory cells must be programmed to the SET state or to the RESET state to represent the logic value of the corresponding data bit of the data word.

At 258, controller 118 programs up to all of the memory cells to which the data word is to be written to the resistance state appropriate to represent the logic value of the corresponding data bit of the data word based on the SET resistance value determined at 256. According to one embodiment, controller 118 compares the SET resistance value of each memory cell to which the data word is to be written to a predetermined threshold level. According to one embodiment, if the SET resistance value of a memory cell determined at 256 is greater than the predetermined threshold value, write circuit 102 employs a modified write operation to program the resistance state of the memory cell to that which is required to represent the logic value of the corresponding data bit of the data word. In one embodiment, the threshold value is equal to verify SET resistance level 194 (see FIG. 6).

In one embodiment, since the memory cells were programmed to the SET state at 254, controller 118 programs only those memory cells which must be written to the RESET state to represent the logic value of the corresponding data bit of the data word. According to such an embodiment, if the SET resistance value (as determined at 256) of a memory cell to be written to the RESET state is greater than the predetermined threshold value, write circuit 102 employs a modified or adjusted RESET process to write the memory cell to the RESET state, but otherwise employs a "normal" or predetermined RESET process if the SET resistance value does not exceed the threshold value. In one embodiment, a modified RESET process includes, for example, employing a RESET pulse having a shorter quench time $T_Q$ 158 or a higher current or voltage magnitude, relative to "normal" or predetermined RESET pulse.

According to one embodiment, the RESET process is iteratively modified or adjusted (e.g. quench time and/or current and voltage magnitudes iteratively adjusted) until the RESET resistance value achieves a desired value (e.g. lies within the desired RESET resistance range). In one embodiment, the SET resistance value is compared to a plurality of SET resistance value ranges, with each range corresponding to a different "modified" or "adjusted" RESET process. For example, in one embodiment, three SET resistance value ranges may be employed, with a first one of the ranges corresponding to a desired SET resistance range (e.g. SET resistance range 176 of FIG. 6), and second and third ranges of SET resistance values being greater than the desired SET resistance range. If the SET resistance value lies within the first range, the predetermined RESET process is employed, if the SET resistance value lies within the second range an adjusted RESET process having a first adjusted quench time is employed, and if the SET resistance value lies within the second range an adjusted RESET process having a second adjusted quench time is employed. Any number of SET resistance value ranges may be employed.

In another embodiment, in addition to programming those memory cells which must be written to the RESET state, controller 118 employs a modified SET process to re-write to a SET state those memory cells which must be written to a SET state to represent the logic value of the corresponding data bit of the data word but whose SET resistance value (as determined at 256) exceeds the predetermined threshold value. According to one embodiment, a modified SET process includes, for example, employing a SET pulse having a longer set time $T_{SET}$ 156 or a higher current or voltage magnitude as compared to a "normal" SET pulse. It is noted that the SET processes may be modified or adjusted in fashions similar to those described above with regard to the adjustment or selection of an adjusted RESET process.

According to one embodiment, in lieu of employing a modified SET or RESET pulse, controller 118 modifies the SET and/or RESET process by redirecting or mapping the data bit to a known "good" location within the memory array if the SET resistance value of a memory cell determined at 256 is greater than the threshold value.

By modifying the programming or write operation employed for a given memory cell based on the SET resistance value of the memory cell measured via a single-sided, fast verify SET read operation (e.g. <60 ns), as described herein, memory device 100 is better able to ensure that the memory cells, such as memory cell 106a, will have a resistance value in either the SET state or the RESET state that provides a desired margin from standard read resistance level 188. A memory device, such memory device 100, employing such a single-sided verify SET technique to both determine the actual SET resistance values and to predict the RESET resistance characteristics of memory cells of an array (e.g. memory cells 106a-106d) reduces data errors and improves system reliability without employing a time-consuming verify RESET read operation (e.g. 600 ns). As result, such predictive operation techniques may enable phase change memory devices to replace FLASH memories in some applications.

Figure 11:
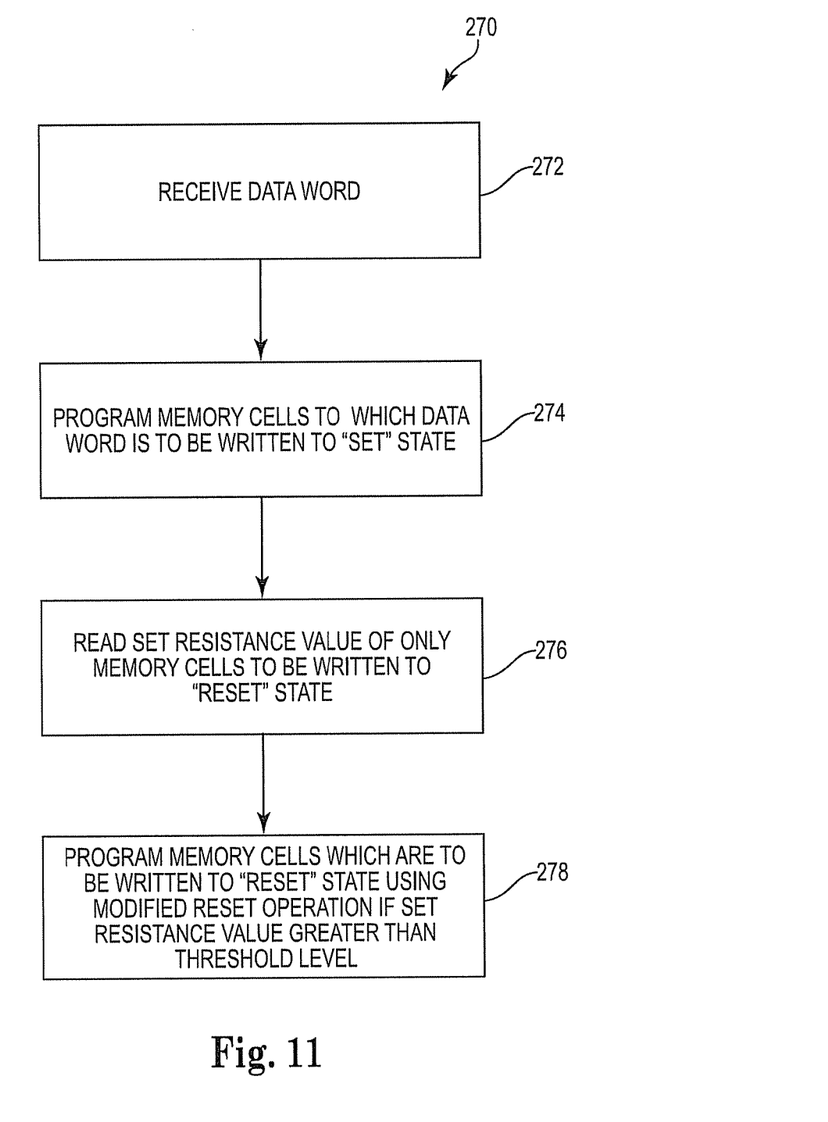
FIG. 11 is a flow diagram illustrating a process for writing data to a phase change memory using predictive operation according to one embodiment.

FIG. 11 is a flow diagram generally illustrating a process 270, according to one embodiment, for writing data to a phase change memory using SET resistance values to predict memory cell operation. Process 270 begins at 272 with memory device 100 receiving a data word consisting of a plurality of data bits (e.g. a 16/32/64 bit data word), such as from host 92. Each data bit is to be written to a corresponding one of a plurality of resistivity changing memory cells of memory device 100, such as memory cell 106a, and has one of a first logic value and a second logic value (e.g. a logic "0" and logic "1"), each of which is represented by one of at least two resistance states of a memory cell, including a low resistance state (SET state) and a high resistance state (RESET state). In one embodiment, for example, the first logic value is a logic "0" and is represented by the low resistance (crystalline state) or SET state of the memory cell, and the second logic value is a logic "1" and is represented by the high resistance (amorphous state) or RESET state of the memory cell.

At 274, each memory cell of the plurality of memory cells to which the data word is to be written is programmed to the low resistance, SET state. At 276, a verify SET read is performed, such as via sense circuit 108, to measure the SET or low resistance value of only those memory cells which must be programmed to the RESET state in order to represent the logic "1" value of the corresponding data bit of the data word.

At 278, those memory cells which are to be written to the RESET state and whose SET resistance values do not exceed a predetermined threshold level are programmed to the RESET state using a "normal" RESET operation. In one embodiment, the predetermined threshold value is equal to a verify SET resistance level, such as indicated by the dashed line at 194 of FIG. 6. However, those memory cells which are to be written to the RESET state and whose SET resistance values are greater than the predetermined threshold level are programmed to the RESET state using a "modified" RESET operation. In one embodiment, a modified RESET operation includes employing a RESET pulse, such as RESET pulse 154, having a modified quench time $T_Q$ 158 (e.g. a shorter duration) or a modified magnitude relative to a quench time or magnitude relative to a RESET pulse employed for a "normal" RESET operation.

Figure 12:
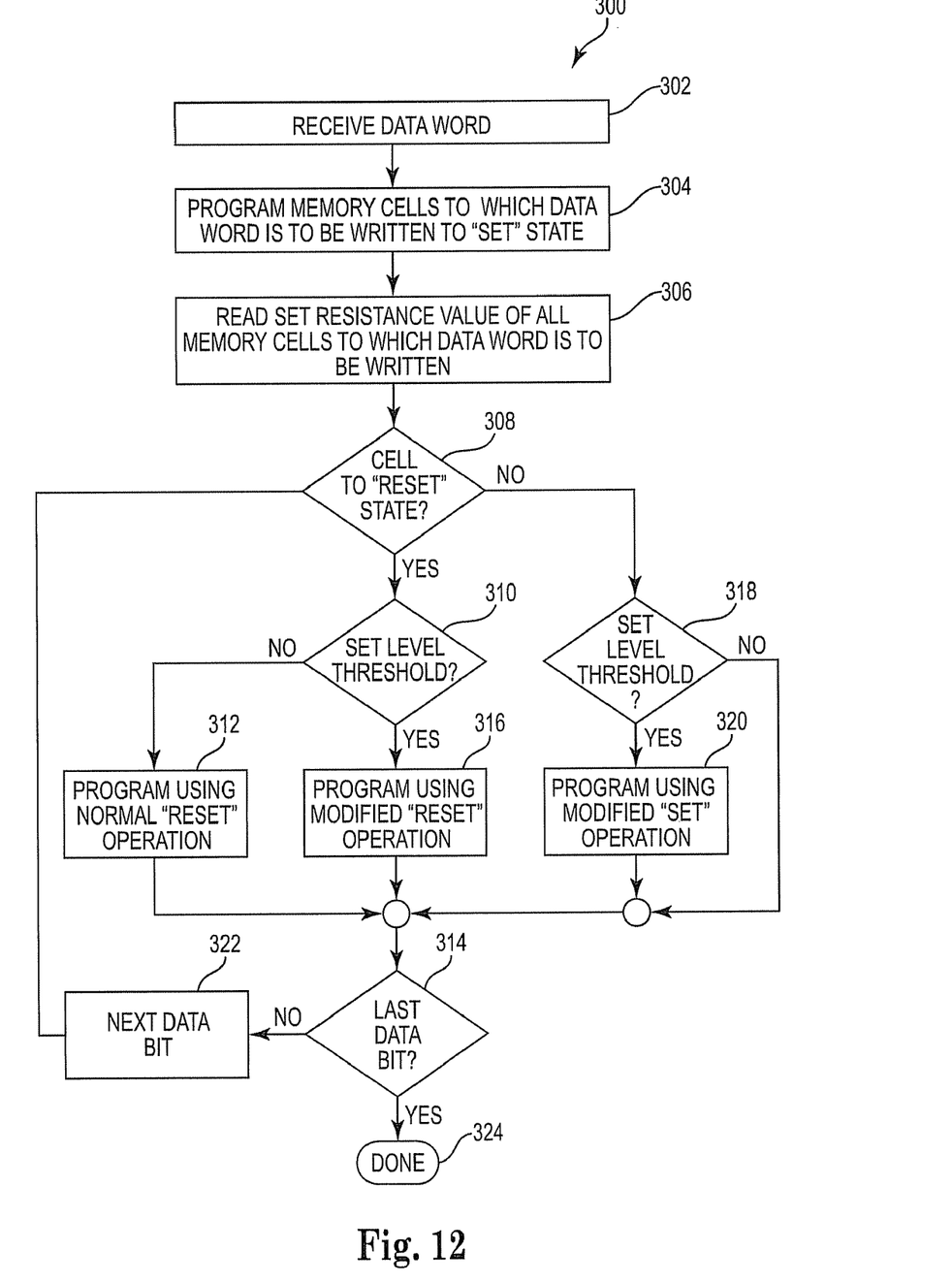
FIG. 12 is a flow diagram illustrating a process for writing data to a phase change memory using predictive operation according to one embodiment.

FIG. 12 is a flow diagram generally illustrating one embodiment of a process 300 for writing data to a phase change memory device, such as memory device 100, employing predictive operation techniques according to the present disclosure. Process 300 begins at 302 with memory device 100 receiving a data word consisting of a plurality of data bits (e.g. 16, 32, 64), such as from host 92. Each data bit is to be written to a corresponding one of a plurality of resistivity changing memory cells of memory device 100, such as memory cell 106a, and has one of a first logic value and a second logic value (e.g. a logic "0" and logic "1"), each of which is represented by one of at least two resistance states of a memory cell, including a low resistance state (SET state) and a high resistance state (RESET state). In one embodiment, for example, the first logic value is a logic "0" and is represented by the low resistance (crystalline state) or SET state of the memory cell, and the second logic value is a logic "1" and is represented by the high resistance (amorphous state) or RESET state of the memory cell.

At 304, each of the memory cells to which the data word is to be written is programmed or SET to the low resistance or substantially crystalline state. At 306, a verify SET read is performed, such as via sense circuit 108, to determine a SET resistance value for each of the memory cells to which the data word is to be written.

At 308, beginning with a first data bit of the data word, process 300 queries whether the corresponding memory cell is to be programmed to the RESET state in order to represent the logic value (e.g. logic value "1") of the data bit. If the answer to the query at 308 is "yes", process 300 proceeds to 310, where it is queried whether the SET resistance value of the memory cell measured at 306 is greater than a threshold value. In one embodiment, the threshold value is equal to a verify SET resistance level, such as indicated by the dashed line at 194 of FIG. 6.

If the answer to the query at 310 is "no", process 300 proceeds to 312 where the memory cell is programmed to the RESET state using a "normal" RESET operation, such as application of RESET pulse 154 having a normal/standard quench time $T_Q$ 158 and magnitude. Process 300 then proceeds to 314.

If the answer to the query at 310 is "yes", process 300 proceeds to 316 where the memory cell is programmed to the RESET state using a "modified" RESET operation. In one embodiment, a modified RESET operation includes employing a RESET pulse, such as RESET pulse 154, having a modified quench time $T_Q$ 158 (e.g. a shorter duration) or a modified magnitude relative to a quench time or magnitude of a RESET pulse employed for a "normal" RESET operation.

If the answer to the query at 308 is "no", process 300 proceeds to 318 where it is queried whether the SET resistance value of the memory cell measured at 306 is greater than the threshold value. If the answer to the query at 318 is "no", the SET resistance value of the memory cell has an acceptable SET resistance value, and process 300 proceeds to 314.

If the query at 318 is "yes", process 300 proceeds to 320 where the memory cell is re-programmed to the SET state using a "modified" SET operation. In one embodiment, a modified SET operation includes employing a SET pulse, such as SET pulse 152, having a modified set time $T_{SET}$ 156 (e.g. a longer duration) or a modified magnitude relative to a set time or magnitude of a "normal" SET pulse. Process 300 then proceeds to 314.

At 314, process 300 queries whether the present data bit is the last data bit of the data word to be written to memory device 100. If the answer to the query at 314 is "no", process 300 moves to a next data bit of the data word, as indicated at 322, and process 300 is repeated for the next data bit beginning at 308. If the answer to the query at 314 is "yes", process 314 is complete, as indicated at 324. Process 300 is repeated for each data word to be written to the memory device.

Although not explicitly illustrated by FIGS. 10, 11, and 12, as mentioned earlier, an alternative to employing a modified RESET and/or SET pulse when the SET resistance value is not within a desired range, the data bit is redirected or mapped the to a known "good" location within the memory array.

As generally illustrated and described above, the SET resistance value of a memory cell is determined and evaluated each time a data bit is written to the memory cell. Subsequently, based on the determined SET resistance value, either a normal or a modified/adjusted RESET and/or the SET operation is employed for writing the data bit to the memory cell. While evaluating the SET resistance values for each WRITE operation may be beneficial for critical applications having specified failure rates which are very stringent, it may not be necessary for less critical applications with less stringent failure rates.

According to one embodiment, the frequency of the reading of the SET resistance values of the memory cells, and adjustment or modification of the RESET and/or SET operations based thereon, varies based on a specified failure rate of memory device 100. For example, according to one embodiment, the SET resistance values of each memory cell of the memory device are read and the RESET and/or SET operations for the memory cells are adjusted only once at manufacture of the memory device. In other embodiments, the SET resistance values of each memory cell of the memory device are measured and the RESET and/or SET operations adjusted periodically during operation of the memory device.

Furthermore, while the specific embodiments described herein are focused primarily on phase change memory elements, the embodiments can be modified and applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of operating an integrated circuit comprising:
   determining a resistance value of at least one resistivity-changing memory cell when the memory cell is in a low-resistance state, the at least one resistivity-changing memory cell configured to be programmable to at least the low-resistance state and a high-resistance state;
   comparing the resistance value to a threshold value; and
   selecting, based on the comparison, a cell reset process to be employed for programming the at least one resistivity-changing memory cell to the high-resistance state including:
      selecting a predetermined reset process as the cell reset process when the resistance value is less than the threshold value; and
      adjusting the predetermined process and selecting the adjusted predetermined reset process as the cell reset process when the resistance value is at least equal to the threshold value.

2. The method of claim 1, wherein adjusting the predetermined process includes iteratively adjusting the predetermined reset process until a reset resistance value of the at least one resistivity-changing memory cell is within a desired reset resistance value range.

3. The method of claim 1, wherein adjusting the predetermined process includes selecting an adjusted predetermined reset process from a plurality of adjusted predetermined reset processes, each of which is associated with a different range of resistance values, and wherein the adjusted predetermined reset process selected as the cell reset process is associated with the range of resistance values in which in the resistance value lies.

4. The method of claim 1, wherein the at least one resistivity-changing memory cell comprises a phase change memory cell.

5. The method of claim 1, wherein the predetermined reset process includes applying a reset current pulse to the at least one resistivity-changing memory cell, the reset current pulse having an amplitude and a quench time, and wherein the adjusting includes adjusting the amplitude and/or quench time based on the resistance value.

6. The method of claim 1, wherein the determining, the comparing, and the selecting are performed only once at manufacture of the integrated circuit.

7. The method of claim 1, wherein the determining, the comparing, and the selecting are performed each time the at least one resistivity changing memory cell is to be programmed to the high-resistance state.

8. The method of claim 1, wherein the comparing, and the selecting are performed periodically during operation of the integrated circuit.

9. A method of operating an integrated circuit comprising:
   employing a set process to program at least one resistivity changing material memory cell to a low-resistance state, the at least one memory cell being programmable to at least the low-resistance state and a high resistance state;
   determining a resistance value of the at least one resistivity changing material memory cell in the low-resistance state;
   comparing the resistance value to a threshold value;
   employing a reset process to program the at least one memory cell to the high-resistance state when the resistance value is below the threshold value; and
   adjusting the reset process and employing the adjusted reset process to program the at least one memory cell to the high-resistance state when the resistance value is at least equal to the threshold value.

10. The method of claim 9, wherein the reset process includes applying a reset current pulse having an amplitude and a quench time, and wherein adjusting the reset process includes adjusting the amplitude and/or quench time based on the resistance value.

11. The method of claim 9, further comprising:
    adjusting the set process and employing the adjusted set process to program the at least one memory cell to the low-resistance state when the resistance value is at least equal to the threshold value.

12. The method of claim 11, wherein the set process includes applying a set current pulse having an amplitude and a set time, and wherein adjusting the set process includes adjusting the amplitude and/or set time based on the resistance value.

13. The method of claim 9, wherein the at least one resistivity changing memory cell comprises a phase change memory cell.

14. A semiconductor device comprising:
    at least one resistivity changing memory cell configured to be programmable to at least a low-resistance state and a high-resistance state; and
    a controller configured to:
       determine a resistance value of the at least one resistivity changing memory cell when programmed to the low-resistance state;
       to compare the resistance value to a threshold value; and to select, based on the comparison, a cell reset process to be performed to program the at least one resistivity changing memory cell to the high-resistance state including:
  to select a predetermined reset process as the cell reset process when the resistance value is less than the threshold value; and
  to adjust the predetermined reset process and to select the adjusted predetermined reset process as the cell reset process when the resistance value is at least equal to the threshold value.

15. The semiconductor device of claim 14, wherein the predetermined reset process includes applying a reset current pulse having an amplitude and a quench time to the at least one resistivity changing memory cell, and wherein to adjust the predetermined reset process the controller is configured to adjust the amplitude and/or quench time based on the resistance value.

16. The semiconductor device of claim 14, wherein the controller is configured to select, based on the comparison, a cell set process to be performed to program the at least one resistivity changing memory cell to the low-resistance state including:
  to select a predetermined set process as the cell set process when the resistance value is less than the threshold value; and
  to adjust the predetermined set process and to select the adjusted predetermined set process as the cell set process when the resistance value is at least equal to the threshold value.

17. The semiconductor device of claim 16, wherein the predetermined set process includes applying a set current pulse having an amplitude and a set time to the at least one resistivity changing memory cell, and wherein to adjust the predetermined set process the controller is configured to adjust the amplitude and/or set time based on the resistance value.

18. The semiconductor device of claim 14, wherein the at least one memory cell comprises a phase change memory cell.

19. A method of operating a semiconductor memory comprising:
  receiving a data word comprising a plurality of data bits, each data bit of the data word to be written to a corresponding memory cell of a plurality of resistivity changing memory cells, each data bit and having one of a first and a second logic value which are represented by a corresponding one of a low-resistance state and a high-resistance state to which each resistivity changing memory cell is configured to be programmed;
  programming each resistivity changing memory cell to which the data word is to be written to the low-resistance state;
  comparing a resistance value of the low-resistance state of each memory cell of selected memory cells of the plurality of memory cells to which the data word is to be written to a threshold value;
  programming the resistance state of each of the selected memory cells to the one of the low-resistance state and the high-resistance state which represents the logic value of the corresponding data bit employing a cell programming process which is based on the comparison of the resistance value of the low-resistance state to the threshold value.

20. The method of claim 19, wherein the selected memory cells comprise each of those memory cells which must be programmed to the high-resistance state to represent a logic value of a corresponding data bit which is to be written to the memory cell.

21. The method of claim 20, wherein for each of the selected memory cells, the programming includes:
  selecting a predetermined programming process as the cell programming process to program the cell to the high-resistance state when the resistance value is less than the threshold value; and
  adjusting the predetermined programming process and selecting the adjusted predetermined programming process as the cell programming process to program the cell to the high-resistance state when the resistance value is at least equal to the threshold value.

22. The method of claim 21, wherein the predetermined programming process includes applying an electrical pulse having an amplitude and a quench time to the memory cell, and wherein adjusting the predetermined programming process includes adjusting the amplitude and/or the quench time.

23. A method of operating a semiconductor memory device comprising:
  programming to a crystalline state each phase change memory cell of a plurality of phase change memory cells to which a data word comprising a plurality of data bits is to be written;
  determining a resistance value of the crystalline state of only those phase change memory cells of the plurality of phase change memory cells which must be programmed to an amorphous state to represent a logic value of a corresponding data bit of the data word;
  comparing each of the resistance values to a threshold value; and
  for each of those phase change memory cells which must be programmed to an amorphous state to represent a logic value of the corresponding data bit of the data word, performing a predetermined reset process to program the memory cell to the amorphous state when the resistance value is less than the threshold value, and adjusting the predetermined reset process and performing the adjusted predetermined process to program the memory cell to the amorphous state when the resistance value is at least equal to the threshold value.

24. The method of claim 23, wherein the predetermined reset process includes applying a reset current pulse to the memory cell, the reset current pulse having an amplitude and a quench time, and wherein adjusting the predetermined reset process includes adjusting the amplitude and/or quench time based on the comparison of the resistance value to the threshold value.

* * * * *